(12) United States Patent
Polyudov

(10) Patent No.: US 7,711,891 B1
(45) Date of Patent: May 4, 2010

(54) METHOD, SYSTEM, AND COMPUTER-READABLE MEDIUM FOR UPDATING MEMORY DEVICES IN A COMPUTER SYSTEM

(75) Inventor: Feliks Polyudov, Lilburn, GA (US)

(73) Assignee: American Megatrends, Inc., Norcross, GA (US)

( * ) Notice: Subject to any disclaimer, the term of this patent is extended or adjusted under 35 U.S.C. 154(b) by 0 days.

(21) Appl. No.: 11/969,015

(22) Filed: Jan. 3, 2008

Related U.S. Application Data

(63) Continuation of application No. 10/391,966, filed on Mar. 18, 2003, now Pat. No. 7,353,323.

(51) Int. Cl.
G06F 13/00 (2006.01)

(52) U.S. Cl. .................... 711/103; 365/185.33; 714/42; 714/718

(58) Field of Classification Search .................. 711/103
See application file for complete search history.

(56) References Cited

U.S. PATENT DOCUMENTS

| | | | |
|---|---|---|---|
| 4,752,871 A | 6/1988 | Sparks et al. |
| 5,361,343 A | 11/1994 | Kosonocky et al. |
| 5,519,847 A | 5/1996 | Fandrich et al. |
| 5,524,230 A | 6/1996 | Sakaue et al. |
| 5,603,001 A | 2/1997 | Sukegawa et al. |
| 5,648,929 A | 7/1997 | Miyamoto |
| 5,663,909 A | 9/1997 | Sim |
| 5,761,702 A | 6/1998 | Matsufuji |
| 5,777,923 A | 7/1998 | Lee et al. |
| 5,809,515 A | 9/1998 | Kaki et al. |
| 5,913,215 A | 6/1999 | Rubinstein et al. |
| 6,131,139 A | 10/2000 | Kikuchi et al. |

(Continued)

OTHER PUBLICATIONS

U.S. Official Action dated Mar. 28, 2005 in U.S. Appl. No. 10/391,966.
U.S. Official Action dated Sep. 19, 2005 in U.S. Appl. No. 10/391,966.

(Continued)

*Primary Examiner*—Christian P Chace
*Assistant Examiner*—Matthew Bradley
(74) *Attorney, Agent, or Firm*—Hope Baldauff Hartman, LLC

(57) ABSTRACT

A method is provided for simultaneously updating the contents of multiple memory devices in a computer system. The contents of each of the memory devices are organized as a series of blocks. One of the memory devices is selected as a current device. A determination is then made as to whether the blocks of the current device need to be updated. The blocks of the current device are updated until a memory wait state is generated by the current device. In response to the memory wait state being generated by the current device, a determination is made as to whether the blocks contained in any of the other memory devices remain to be updated. If there are blocks in any of the other memory devices remaining to be updated, a next memory device is identified having blocks to be updated. The identified memory device is then selected as the current device. Finally, the steps of the method are repeated for each current device until all of the blocks contained in each of the multiple memory devices have been updated. The memory devices may be utilized to store a basic input/output system (BIOS) for the computer system.

20 Claims, 8 Drawing Sheets

U.S. PATENT DOCUMENTS

| | | |
|---|---|---|
| 6,215,705 B1 | 4/2001 | Al-Shamma |
| 6,236,593 B1 | 5/2001 | Hong et al. |
| 6,272,052 B1 | 8/2001 | Miyauchi |
| 6,721,820 B2 | 4/2004 | Zilberman et al. |
| 6,834,322 B2 | 12/2004 | Sukwgawa |
| 2002/0004878 A1 | 1/2002 | Norman |
| 2002/0073272 A1 | 6/2002 | Ko et al. |
| 2003/0033471 A1 | 2/2003 | Lin et al. |
| 2004/0030877 A1 * | 2/2004 | Frid .............................. 713/1 |

OTHER PUBLICATIONS

U.S. Official Action dated Mar. 16, 2006 in U.S. Appl. No. 10/391,966.
U.S. Official Action dated Dec. 12, 2006 in U.S. Appl. No. 10/391,966.
U.S. Official Action dated Jun. 28, 2007 in U.S. Appl. No. 10/391,966.
U.S. Notice of Allowance / Allowability dated Oct. 3, 2007 in U.S. Appl. No. 10/391,966.

* cited by examiner

METHOD, SYSTEM, AND COMPUTER-READABLE MEDIUM FOR UPDATING MEMORY DEVICES IN A COMPUTER SYSTEM

CROSS-REFERENCE TO RELATED APPLICATIONS

This application is a continuation application of U.S. patent application Ser. No. 10/391,966, filed on Mar. 18, 2003 and entitled "Method, System, and Computer-Readable Medium for Updating Memory Devices in a Computer System," issued Apr. 1, 2008 as U.S. Pat. No. 7,353,323, which is expressly incorporated herein by reference in its entirety.

TECHNICAL FIELD

The present invention is related to computer system configuration. More particularly, the present invention is related to updating the contents of memory devices in a computer system.

BACKGROUND OF THE INVENTION

Some computer systems have a firmware basic input/output system ("BIOS") containing basic routines which are accessed to boot the computer as well as to initialize and interface hardware with operating system software. Occasionally, the BIOS may need to be updated to reflect changes in the hardware configuration of the computer system or to add new features. To facilitate BIOS updates, the BIOS of many modern computer systems is stored as groups of memory "blocks" representing the BIOS code. These blocks are typically stored in a type of re-programmable memory device, called "flash memory." In large-scale computing or server platforms, the BIOS may be stored on multiple flash memory chips, also called "flash" memory devices or parts. In computer systems utilizing flash memory devices to store the BIOS, a software update utility may be used to update the contents of the flash memory devices by erasing and re-programming each flash memory device.

Traditionally, flash memory is updated on a block-by-block basis by sequentially erasing and/or programming each block. Furthermore, each block of flash memory is updated regardless of whether the block actually needs updating. Thus, in updating flash memory, blocks remaining unchanged from a previous version would still be updated by the conventional update process.

In computer systems utilizing multiple flash memory devices, updating these devices can be a time-consuming process as the contents of only one flash memory device is updated at a time. Thus, the contents of each flash memory device are updated sequentially. The length of the update process is further increased in that each block of flash memory is updated regardless of whether the block actually needs updating. The wait time currently required for completing the update of multiple flash memory devices increases the potential for interruption of the update process due to an error such as a power failure. As the updating of the flash memory is a very critical operation, interruptions during the update process may make a computer system unbootable.

It is with respect to these considerations and others that the present invention has been made.

SUMMARY OF THE INVENTION

In accordance with the present invention, the above and other problems are solved by methods for simultaneously updating the contents of multiple memory devices in a computer system. These methods utilize a software utility program launched on a processor to simultaneously update the contents of several memory devices associated with the processor.

In accordance with other aspects, the present invention relates to a method for simultaneously updating the contents of multiple memory devices. The contents of each of the memory devices are organized as series of blocks. According to the method, one of the memory devices is selected as a current device. The blocks of the current device are updated until a memory wait state is generated by the current device. In response to the memory wait state being generated by the current device, a determination is made as to whether the blocks contained in any of the other memory devices remain to be updated. If there are blocks in any of the other memory devices remaining to be updated, a next memory device is identified having blocks to be updated. The identified memory device is then selected as the current device. Finally, the steps of the method are repeated for each device until all of the blocks contained in each of the multiple memory devices have been updated.

In updating each block of the current device, a determination may be made as to whether each block of the current device needs to be updated which may include erasing or programming each block. Each block is erased unless binary data in a block is a predetermined value. Each block is programmed if it is determined that at least one byte in a block needs to be programmed. The memory devices may store a BIOS for the computer system.

In accordance with still other aspects, the present invention relates to a method for optimizing the update of the contents of a memory device. The contents of the memory device are organized in a series of blocks. According to the method, a determination is made as to whether each block of the memory device needs to be updated. Then, each block determined to need updating is updated. The blocks may be updated by erasing the contents of each block or programming bytes which make up the contents of each block. The method may be repeated for each block in the memory device until all of the blocks which need to be updated have been updated.

Aspects of the invention may be implemented as a computer process, a computing system, or as an article of manufacture such as a computer program product or computer-readable medium. The computer program product may be a computer storage media readable by a computer system and encoding a computer program of instructions for executing a computer process. The computer program product may also be a propagated signal on a carrier readable by a computing system and encoding a computer program of instructions for executing a computer process.

These and various other features as well as advantages, which characterize the present invention, will be apparent from a reading of the following detailed description and a review of the associated drawings.

DETAILED DESCRIPTION OF THE INVENTION

Figure 1:
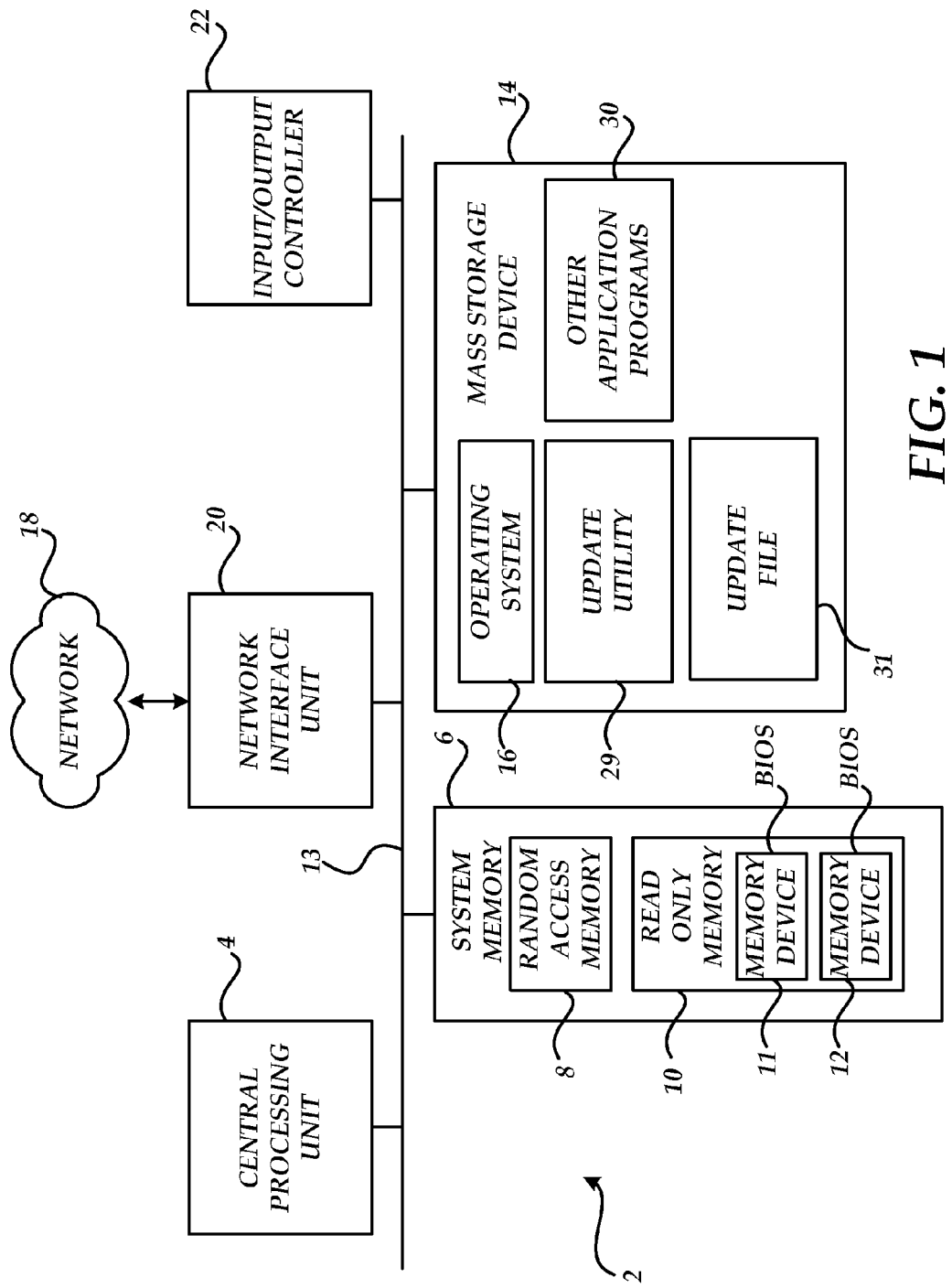
FIG. 1 illustrates a computer system architecture for updating memory devices in a computer system utilized in embodiments of the invention.

Embodiments of the present invention provide methods for updating flash memory devices in a computer system. In the following detailed description, references are made to the accompanying drawings that form a part hereof, and in which are shown by way of illustration specific embodiments or examples. Referring now to the drawings, in which like numerals represent like elements through the several figures, aspects of the present invention and the exemplary operating environment will be described.

FIG. 1 and the following discussion are intended to provide a brief, general description of a suitable computing environment in which the invention may be implemented. While the invention will be described in the general context of program modules that execute in conjunction with an application program that runs on an operating system on a computer system, those skilled in the art will recognize that the invention may also be implemented in combination with other program modules.

Generally, program modules include routines, programs, components, data structures, and other types of structures that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote memory storage devices.

Turning now to FIG. 1, an illustrative computer architecture for a computer system 2 which was discussed briefly above, for practicing the various embodiments of the invention will be described. The computer system 2 includes a standard local or server computer operative to execute one or more application programs, such as update utility 29. As will be described in greater detail below the update utility 29 updates the contents of the memory devices 11 and 12.

Alternatively, the computer system 2 may include another type of computing device operative to access a network 18, such as a personal digital assistant or other type of computer. The computer architecture shown in FIG. 1 illustrates a conventional personal computer, including a central processing unit 4 ("CPU"), a system memory 6, including a random access memory 8 ("RAM") and a read-only memory ("ROM") 10, and a system bus 13 that couples the system memory 6 to the CPU 4.

The ROM 10 further comprises memory devices 11 and 12 which may store a basic input/output system containing the basic routines that help to transfer information between elements within the computer. It should be understood that the contents of memory devices 11 and 12 are organized as multiple blocks which may, for example, represent the BIOS code in the computer system 2 or other program code and/or data. It should be further understood that memory devices 11 and 12 may be re-programmable or "flash" memory devices. The contents of memory devices 11 and 12 will be described in greater detail below with respect to FIG. 2.

The computer system 2 further includes a mass storage device 14 for storing an operating system 16, the update utility 29, and other application programs 30. It will be appreciated by those skilled in the art that the update utility 29 may also be implemented as part of the BIOS in the computer system 2. The mass storage device 14 is connected to the CPU 4 through a mass storage controller (not shown) connected to the system bus 13. The mass storage device 14 and its associated computer-readable media, provide non-volatile storage for the computer system 2. Although the description of computer-readable media contained herein refers to a mass storage device, such as a hard disk or CD-ROM drive, it should be appreciated by those skilled in the art that computer-readable media can be any available media that can be accessed by the computer system 2.

By way of example, and not limitation, computer-readable media may comprise computer storage media and communication media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer.

According to various embodiments of the invention, the computer system 2 may operate in a networked environment using logical connections to remote computers through the network 18. The computer system 2 may connect to the network 18 through a network interface unit 20 connected to the bus 13. It should be appreciated that the network interface unit 20 may also be utilized to connect to other types of networks and remote computer systems. The computer system 2 may also include an input/output controller 22 for receiving and processing input from a number of devices, including a keyboard, mouse, or electronic stylus (not shown in FIG. 1). Similarly, an input/output controller 22 may provide output to a display screen, a printer, or other type of output device.

As discussed briefly above, the mass storage device 14 stores the update utility 29 which includes code for updating memory devices 11 and 12 with new content. The update utility 29 is launched from the mass storage device 14 on the CPU 4 which executes the code for updating the memory devices 11 and 12. Upon launching the update utility 29 the new content is loaded into the RAM 8. The CPU 4 in executing the code to update the memory devices 11 and 12, issues commands to erase the contents of each memory device. The CPU 4 in executing the code may further issue commands to program the contents of each memory device with the new content. It should be understood that the contents of some memory devices, such as flash memory devices, must be erased before they are programmed. The logical operations performed by the update utility 29 for updating the memory devices 11 and 12 will be described in greater detail in the discussion of FIGS. 3-8 below.

Figure 2:
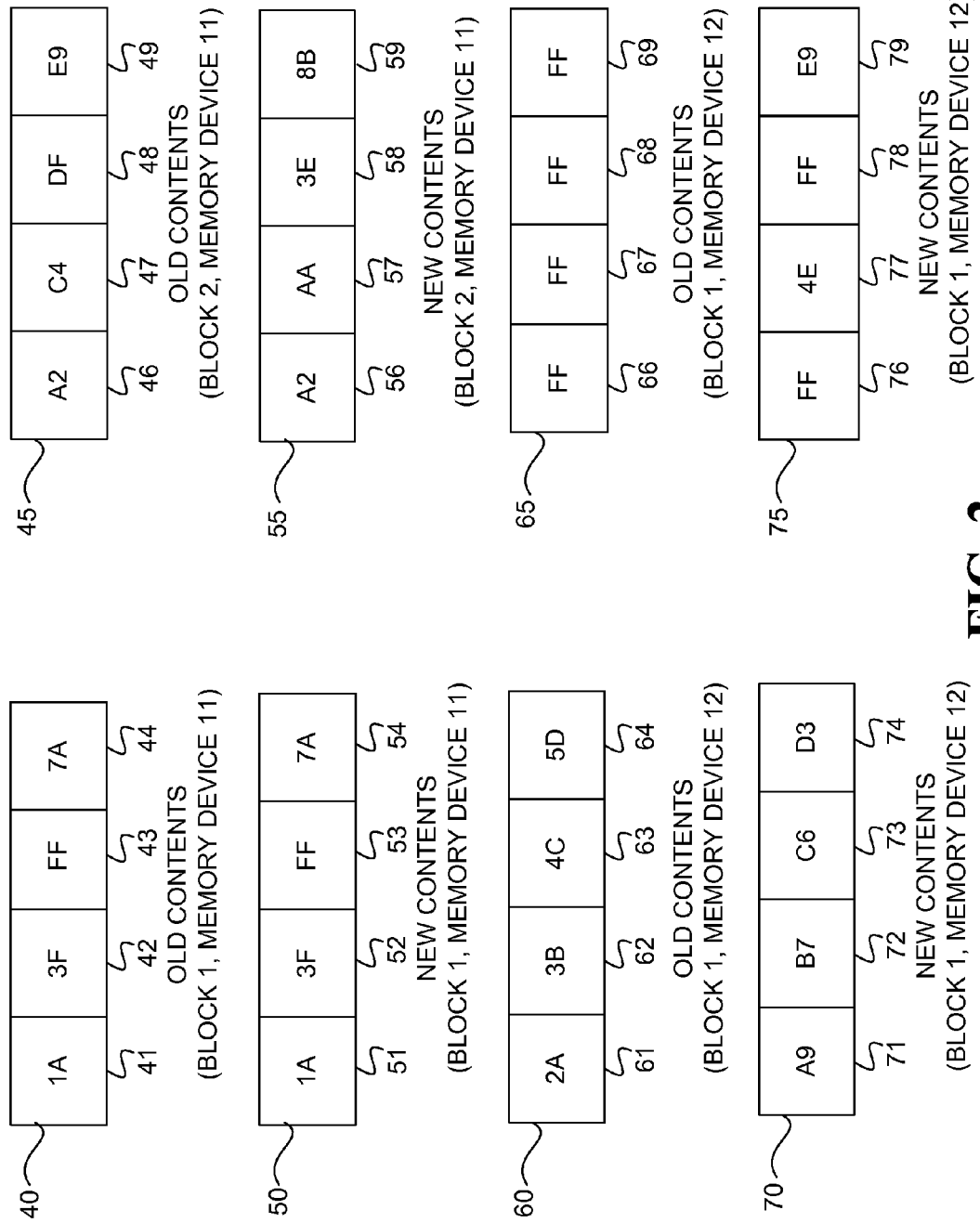
FIG. 2 illustrates a block diagram showing the contents of memory devices in the computer system of FIG. 1 according to an embodiment of the invention.

FIG. 2 is a block diagram illustrating the contents of memory devices 11 and 12 comprising the ROM 10 in the computer system 2 described above in FIG. 1. As shown in FIG. 2, memory device 11 includes blocks of memory 40 and 45. Each block 40 and 45 is divided into bytes (represented in hexadecimal format) 41-44 and 46-49 respectively. Similarly, the memory device 12 includes blocks 60 and 65. Each block 60 and 65 is divided into bytes 61-64 and 66-69 respectively. The bytes in each block represent the contents, such as a BIOS code, of each memory device 11 and 12. As briefly described above, the update utility 29 includes code for updating the contents of memory devices 11 and 12. FIG. 2 shows blocks of new content for the memory devices 11 and 12 in the computer system 2. Blocks 50 and 55 contain the new content for the memory device 11 in bytes 51-54 and 56-59 respectively, while blocks 70 and 75 contain the new content for the memory device 12 in bytes 71-74 and 76-79 respectively.

FIGS. 3-8 show illustrative logical operations performed by the update utility 29 for updating the contents of the memory devices 11 and 12 described above in FIGS. 1-2 according to various embodiments of the invention. The logical operations of the various embodiments of the present invention are implemented (1) as a sequence of computer implemented acts or program modules running on a computing system and/or (2) as interconnected machine logic circuits or circuit modules within the computing system. The implementation is a matter of choice dependent on the performance requirements of the computing system implementing the invention. Accordingly, the logical operations making up the embodiments of the present invention described herein are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

Figure 3:
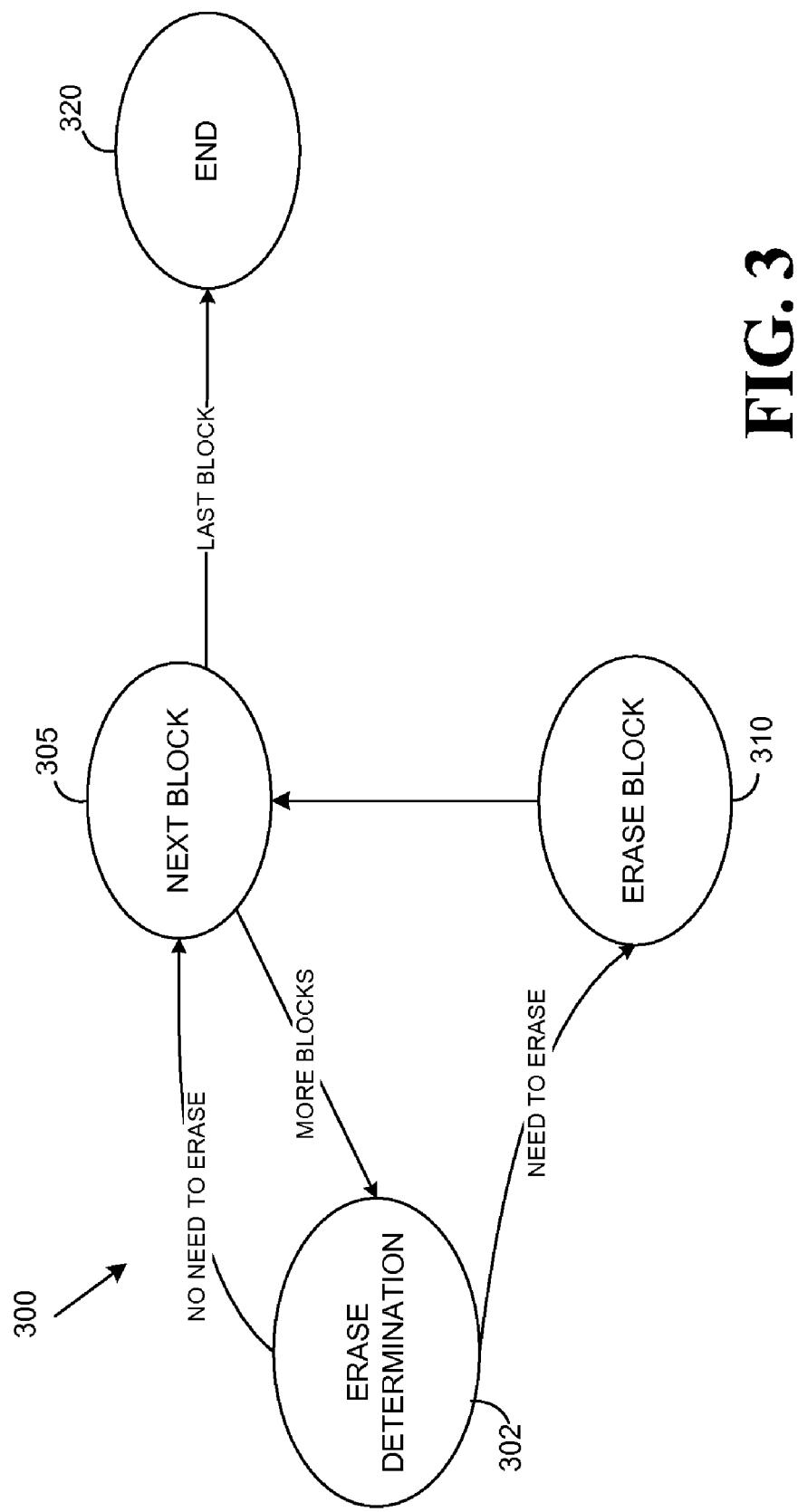
FIG. 3 illustrates a state machine routine for erasing a memory device in the computer system of FIG. 1 according to an embodiment of the invention

Turning now to FIG. 3, an illustrative state machine routine 300 implemented by the update utility 29 is shown for erasing a memory device in the computer system 2. The state machine routine 300 begins at erase determination operation 302 where the update utility 29 determines whether the first block in a memory device needs to be erased.

As is known to those skilled in the art, blocks of memory in flash memory devices may be erased by changing the binary state of each bit in a block to a "one." If it is determined at operation 302 that the first block in the memory device needs to be erased, the routine 300 continues to erase block operation 310 where the update utility 29 sends an erase command to the memory device to erase the first block of memory. After the block in the memory device is erased at operation 310, the routine then continues to the next block at operation 305 where the update utility 29 moves to the next block of memory in the memory device and determines whether the next block needs to be erased at operation 302. If it is determined at operation 302 that there is no need to erase the first block of memory in the memory device, the routine continues to the next block at operation 305 and determines whether the next block needs to be erased at operation 302. When there are no further blocks remaining in the memory device, the routine ends at 320.

For example, using the illustrative contents of the memory devices 11 and 12 shown in FIG. 2, the memory device 12, block 60 (the first block of memory) is not erased and thus the update utility 29 would erase the block 60 resulting in the bytes 61-64 being rewritten as a series of "ones." The update utility 29 would then move to block 65 (the next block) to determine if the block needs to be erased. Since the bytes 66-69 of block 65 are already erased (i.e., the block contains a series of hex "Fs"), the update utility 29 would determine that it is not necessary to erase the block 65. It will be appreciated that the state machine routine 300 implemented by the update utility 29 optimizes the erasing of memory blocks in that only blocks that need erasing are erased.

Figure 4:
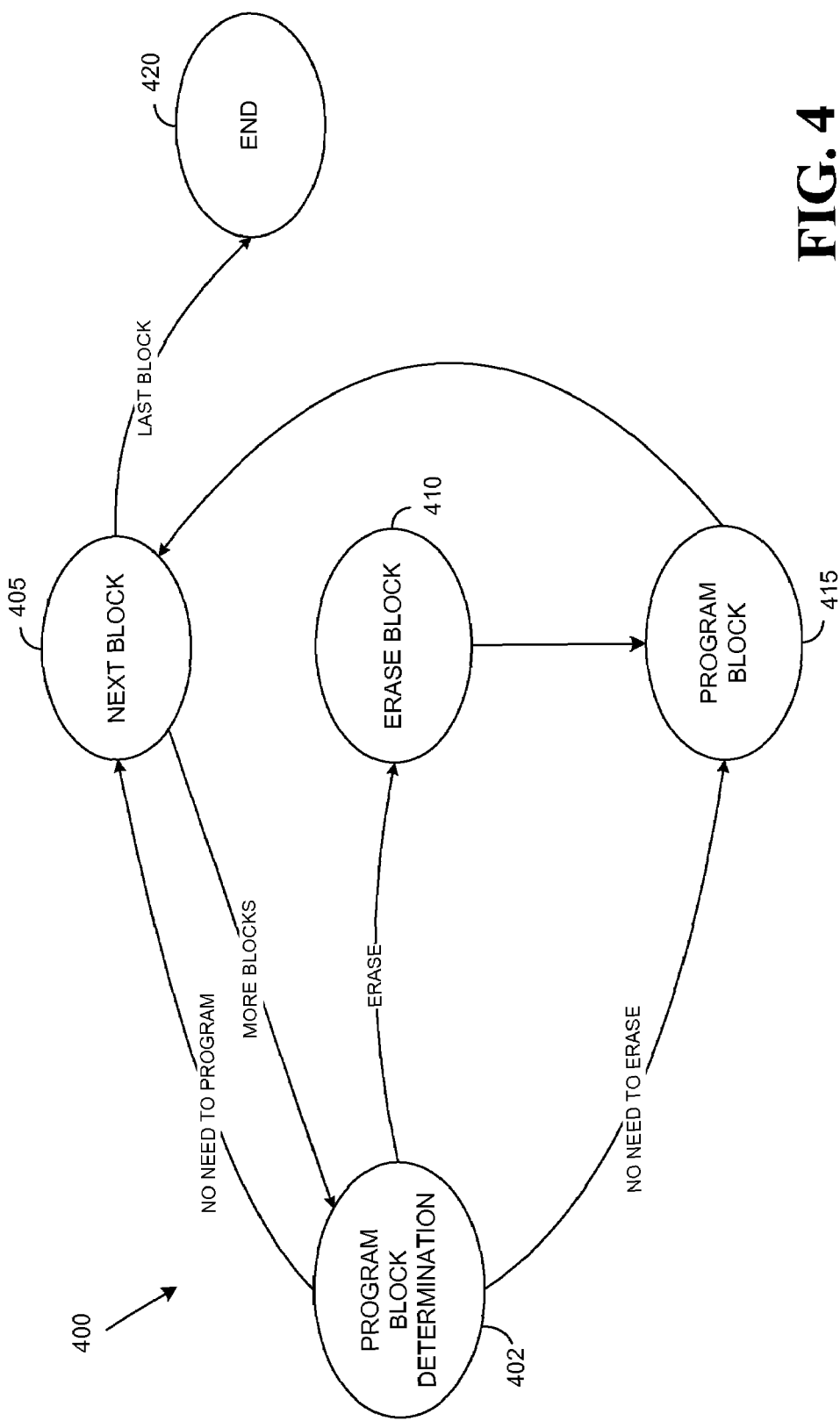
FIG. 4 illustrates a state machine routine for programming a memory device in the computer system of FIG. 1 according to an embodiment of the invention.

FIG. 4 shows an illustrative state machine routine 400 implemented by the update utility 29 for programming a memory device in the computer system 2 according to an embodiment of the invention. The state machine routine 400 begins at program block determination operation 402 where the update utility 29 determines whether the first block in a memory device needs to be programmed. The update utility 29 makes this determination by comparing the byte values currently in the block (the old contents) with the byte values for the block contained in the update file 31 to be written by the update utility (the new contents). If the old contents and the new contents are the same, the update utility 29 determines that the block does not have to be programmed. For example, in the memory device 11, block 40 (the old contents) and block 50 (the new contents) contain the same byte values "1A, 3F, FF, and 7A." Thus, there is no need for the update utility 29 to update the block 40. The routine 400 then continues to the next block at operation 405.

If, on the other hand, the update utility 29 determines that the first block does have to be programmed at program block determination operation 402, then the update utility 29 determines whether the first block needs to be erased. As briefly described above in the discussion of FIG. 1 above, the contents of a memory device must be erased before it can be programmed. The update utility 29 determines whether the first block is erased by determining whether the bit values for the bytes in each block are binary ones.

If it is determined that the first block does not need to be erased, the routine 400 then continues to program block operation 415 to program the block. If it is determined that the first block needs to be erased at program block determination operation 402, the update utility 29 issues commands to erase the block at erase block operation 410 as described in detail above in the description of FIG. 3. The routine 400 then continues to program block operation 415 to program the block.

At program block operation 415, the update utility 29 programs the first block in the memory device. It should be understood that the programming of flash memory devices is performed on a per byte basis. That is, after the old memory contents of each block is erased, the new memory contents from the update file 31 are written to each block to program the memory device. The update utility 29 determines whether a block needs to be programmed by implementing a sub-routine 500 for determining whether each byte in a block needs to be programmed and, if necessary, programming the byte. The program byte operation sub-routine 500 will be discussed in greater detail in the discussion of FIG. 5 below.

After the block is programmed, the routine 400 continues to the next block at operation 405. After the program block determination operation 402 has been applied to each block in the memory device, the routine ends at 420. It will be appreciated that the above-described state machine routine 400 implemented by the update utility 29 optimizes the programming of memory blocks in that only the blocks that need programming are programmed.

Figure 5:
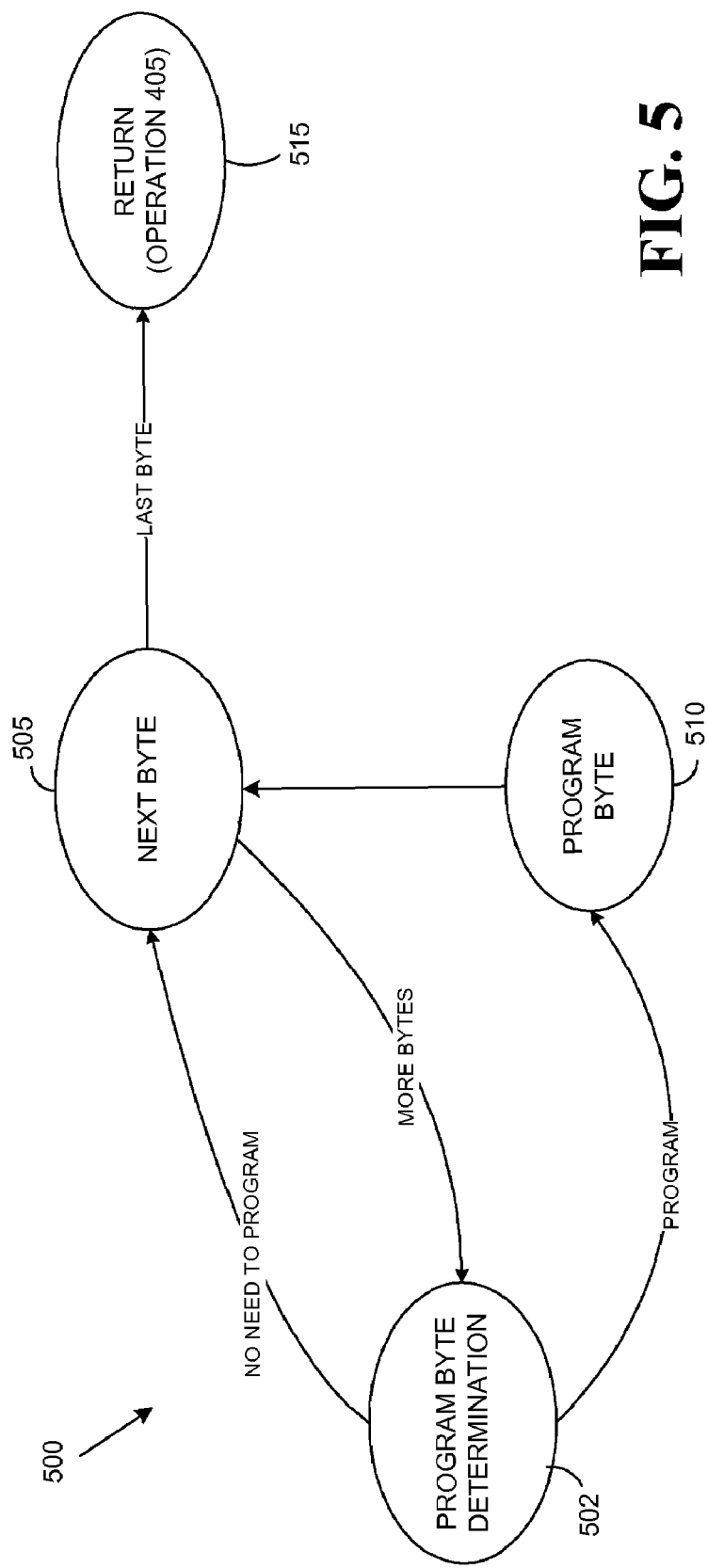
FIG. 5 illustrates a state machine routine for executing byte programming determination and byte programming operations in the blocks of a memory device in the computer system of FIG. 1 according to an embodiment of the invention.

FIG. 5 shows an illustrative state machine sub-routine 500 implemented by the update utility 29 for executing byte programming determination and byte programming operations in the blocks of a memory device in the computer system 2, according to an embodiment of the invention. The sub-routine 500 begins at program byte determination operation 502 where the update utility 29 determines whether the first byte in an erased block of a memory device needs to be programmed. As discussed above, a block is only programmed after if has been erased. The update utility 29 makes this determination by comparing the byte values in the erased block with the byte values for the block contained in the update utility (the new contents). If the update utility 29 determines that the first byte in a block does not need to be programmed at program byte determination operation 502, the routine continues to the next byte at operation 505 where a determination is made for the next byte in the block. If, however, the update utility 29 determines that the first byte does need to be programmed at program byte determination operation 502, the routine continues to program byte operation 510 where the update utility 29 programs the byte by writing the new byte value from the new contents in the corresponding byte position in the block. Prior to programming the byte, the update utility 29 switches the memory device to a programming state and issues a command to write the new byte value. The routine then continues to the next byte at operation 505.

For example, in the memory device 12, all of the bytes in the block 65 have been erased and each has a value of "FF." Bytes 76 and 78 in the block 75 (the new contents for the block 65) have the same byte value "FF" as corresponding bytes 66 and 68 in the erased block 65. As a result, the update utility 29 would determine that there is no need to update these bytes in the block 65. However, bytes 77 and 79 have different values than corresponding bytes 67 and 69. As a result, the update utility 29 would write the byte values for bytes 77 and 79 ("4E" and "E9") into bytes 67 and 69 in the block 65 to program the block.

After the program byte determination operation 502 has been applied to each byte in a block in the memory device, the routine 500 continues to the next block of the memory device by returning to operation 405 in the routine 400 discussed above in FIG. 4. It will be appreciated that the state machine sub-routine 500 implemented by the update utility 29 optimizes byte programming in that only bytes that need programming are programmed.

Figure 6:
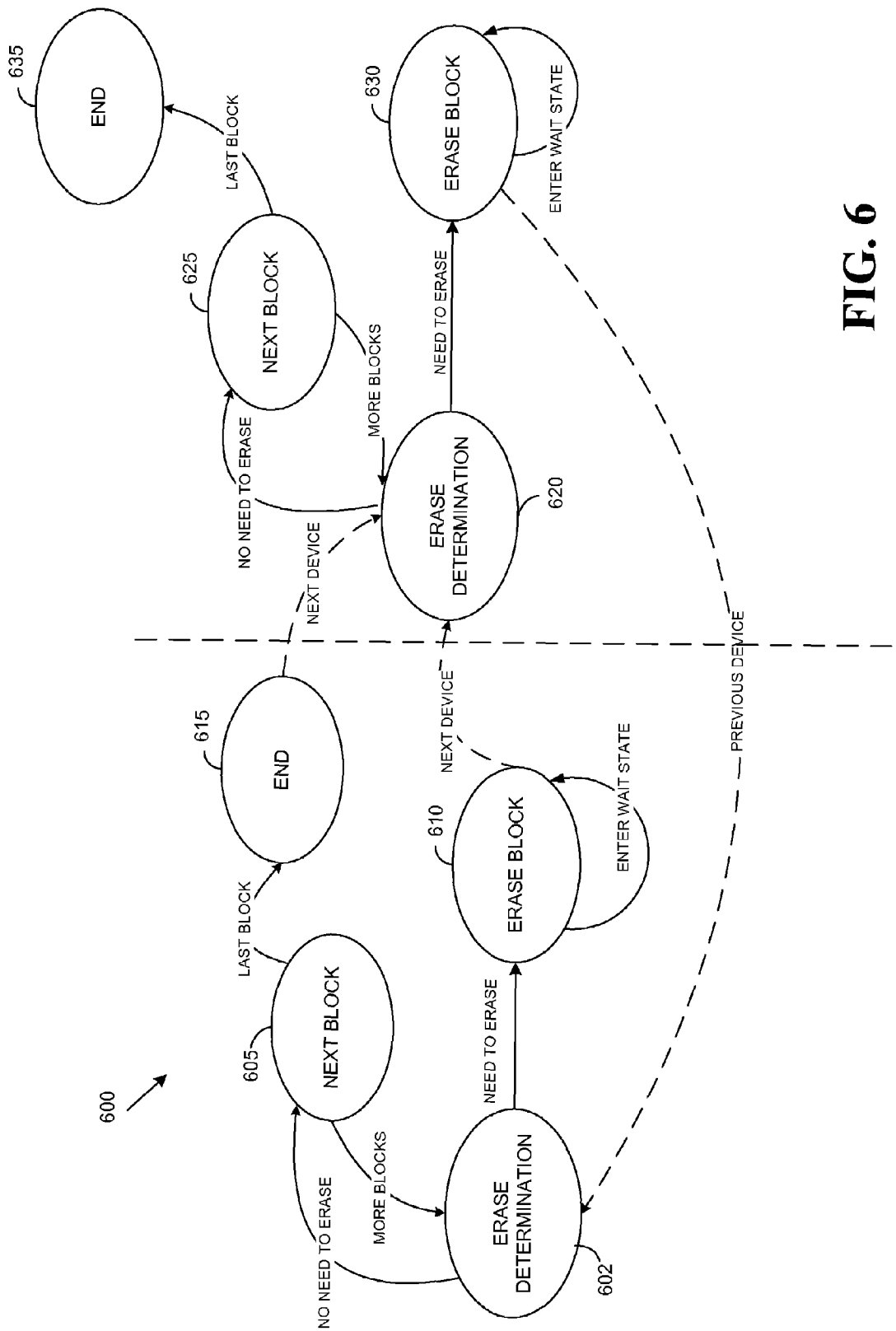
FIG. 6 illustrates a state machine routine for simultaneously erasing multiple memory devices in the computer system of FIG. 1 according to an embodiment of the invention.

FIG. 6 shows an illustrative state machine routine 600 implemented by the update utility 29 is shown for simultaneously erasing multiple memory devices in the computer system 2. The state machine routine 600 begins at erase determination operation 602 where the update utility 29 determines whether the first block in the first memory device needs to be erased. This operation is described in detail above in the discussion of FIG. 3.

If it is determined at erase determination operation 602 that the first block in the first memory device needs to be erased, the routine 600 continues to erase block operation 610 where the update utility 29 sends an erase command to the memory device to erase the first block of memory. During the erase block operation 610, the routine 600 enters a wait state for the first block. Upon entering the wait state the routine 600 remembers the current state in the first block by saving the current state of the block as well as the number of the block being erased, in the memory stack space of the processor 4. It will be appreciated that the processor 4 in the computer system 2 has a separate memory stack space for isolating local data. Thus, the update utility 29 may utilize the stack space in the processor 4 for storing data while it is executing. The routine 600 then continues to the first block in the next memory device and the update utility 29 determines whether the first block in the next memory device needs to be erased at erase determination operation 620.

If it is determined at erase determination operation 620 that the first block in the next memory device needs to be erased, the routine 600 continues to erase block operation 630 where the update utility 29 sends an erase command to erase the first block of memory in the next memory device. During the erase block operation 630, the routine 600 enters a wait state for the block in the next memory device and the routine returns to the first memory device. After returning to the first memory device, the update utility 29 returns to erase determination operation 602. After returning to erase determination operation 602, the update utility 29 retrieves from the memory stack the state of the routine 600 executed on the first block and continues to execute the routine on the first memory device.

If, during the execution of the routine 600 it is determined at erase determination operation 602 in the first memory device or at erase determination 620 in the next memory device that a memory block does not need to be erased, the routine continues to the next block in each device at operations 605 and 625 respectively. The operations of the routine 600 described above are recursively repeated by the update utility 29 until all of the blocks in the first memory device are erased at which point the routine ends on the first memory device at operation 615. After the routine 600 ends on the first memory device, the routine 600 executes on any remaining blocks in the second memory device after which the routine 600 ends at operation 635.

Figure 7:
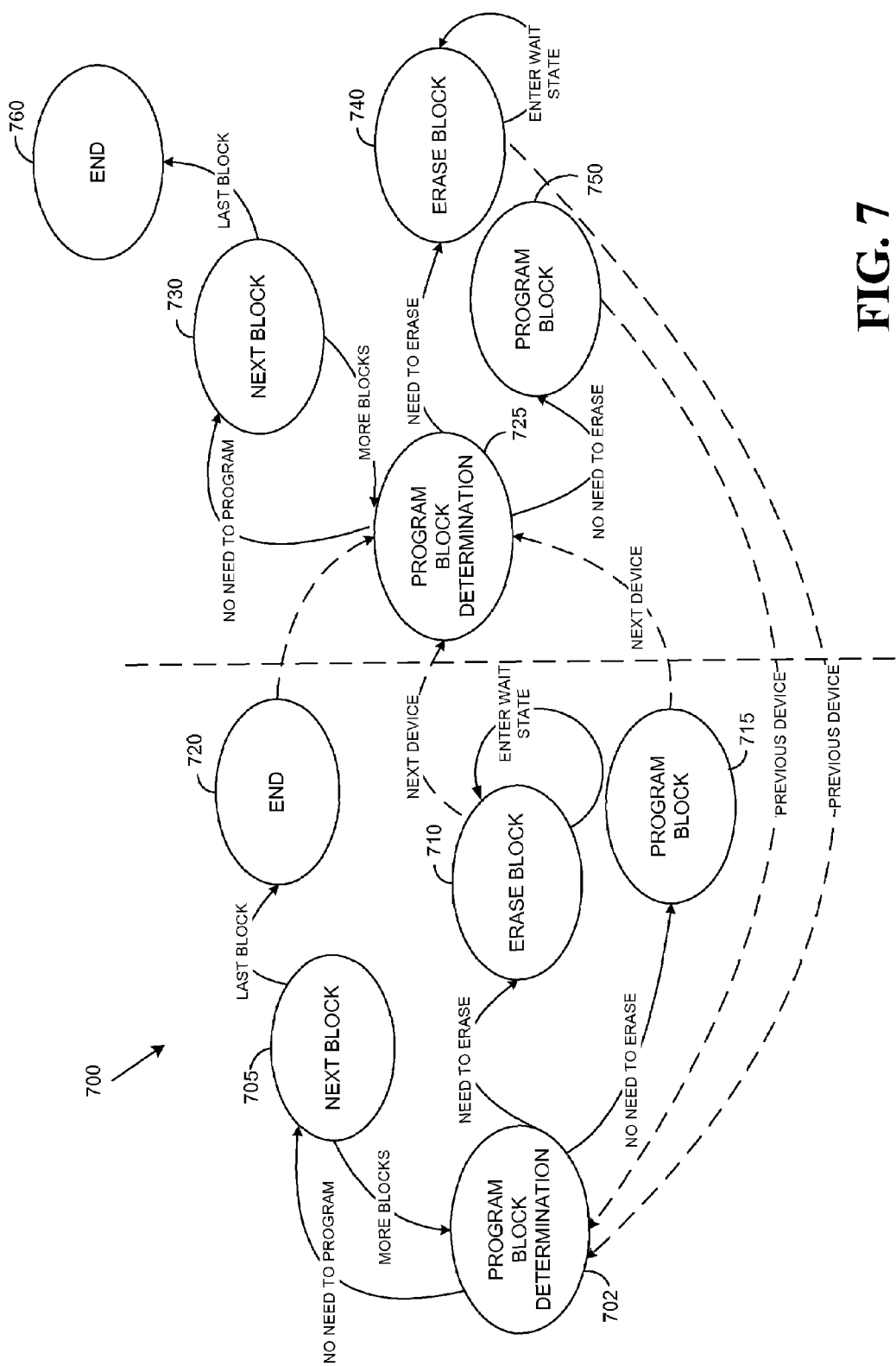
FIG. 7 illustrates a state machine routine simultaneously programming multiple memory devices in the computer system of FIG. 1 according to an embodiment of the invention.

FIG. 7 shows an illustrative state machine routine 700 implemented by the update utility 29 for simultaneously programming multiple memory devices in the computer system 2 according to an embodiment of the invention. The state machine routine 700 begins at program block determination operation 702 where the update utility 29 determines whether the first block in a first memory device needs to be programmed. This operation is described in detail above in the discussion of FIG. 4.

If the update utility 29 determines that the first block of the first memory device needs to be programmed at program block determination operation 702, then the update utility 29 determines whether the first block needs to be erased. As discussed above, a block needs to be erased before it can be programmed. If it is determined that the first block needs to be erased, the routine 700 sends an erase command to the memory device to erase the first block of memory, enters a wait state for the first block, and continues to the first block in the next memory device where the update utility 29 determines whether the first block in the next memory device needs to be programmed at program block determination operation 725. The routine 700 then recursively repeats for the blocks in each memory device as described in detail above in the discussion of FIG. 6.

During the execution of the routine 700, the update utility 29 programs each erased block at program block operation 715 in the first memory device and program block operation 750 in the second memory device as described in greater detail below in the discussion of FIG. 8. The operations of the routine 700 described above are recursively repeated by the update utility 29 until all of the blocks in the first memory device are programmed at which point the routine ends on the first memory device at operation 720. After the routine 700 ends on the first memory device, the routine 700 executes on any remaining blocks in the second memory device after which the routine 700 ends at operation 760.

Figure 8:
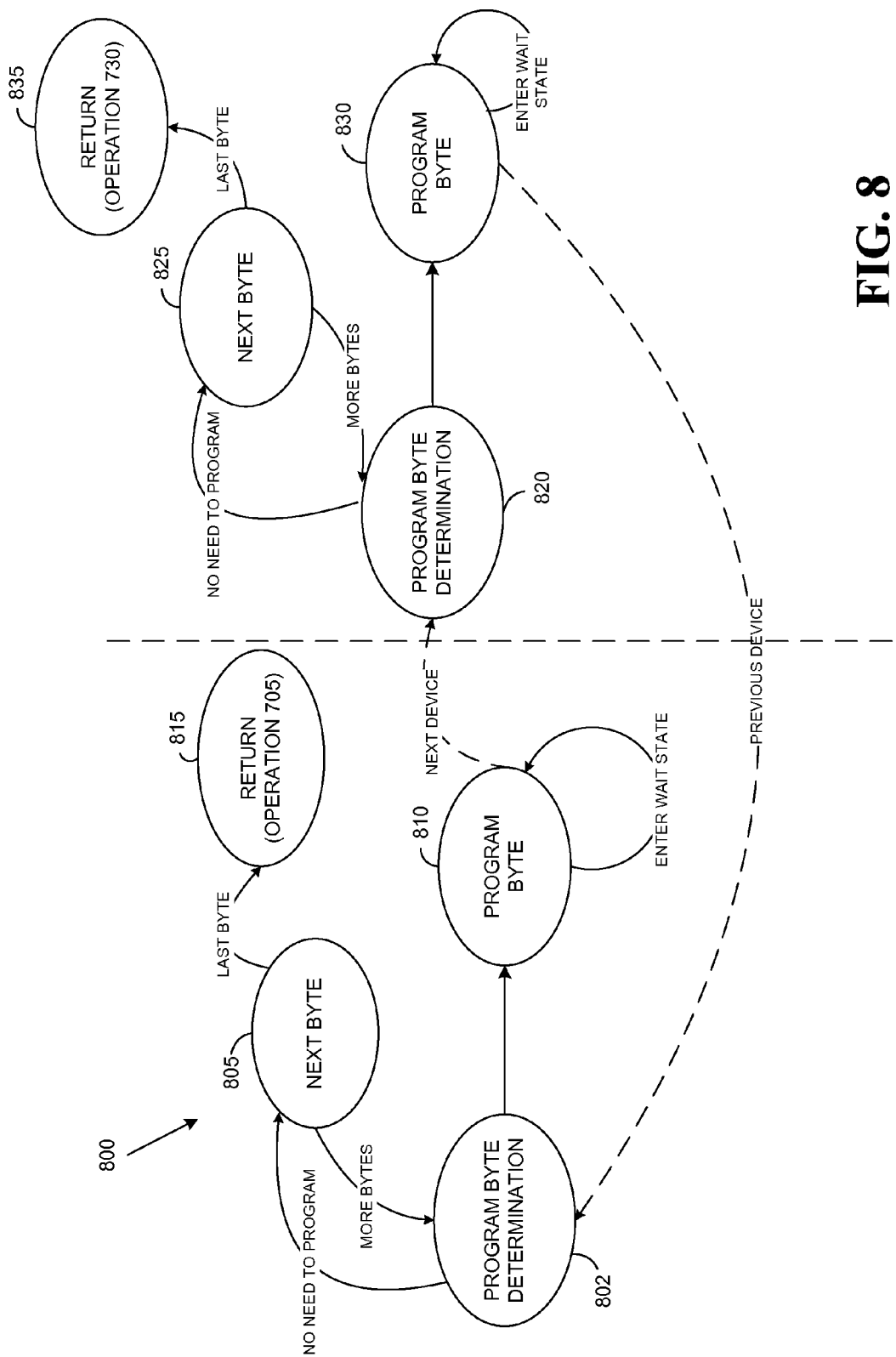
FIG. 8 illustrates a state machine routine for executing byte programming determination and byte programming operations to simultaneously program the blocks of multiple memory devices in the computer system of FIG. 1 according to an embodiment of the invention.

FIG. 8 shows an illustrative state machine sub-routine 800 implemented by the update utility 29 for executing byte programming determination and byte programming operations to simultaneously program the blocks of multiple memory devices in the computer system 2, according to an embodiment of the invention. The sub-routine 800 begins at program byte determination operation 802 where the update utility 29 determines whether the first byte in an erased block of a memory device needs to be programmed. This operation is described in detail above in the discussion of FIG. 5.

If the update utility 29 determines that the first byte in the first memory device does not need to be programmed at program byte determination operation 802, the routine 800 continues to the next byte at operation 805 where a determination is made for the next byte in the block. If, however, the update utility 29 determines that the first byte in the first memory device does need to be programmed at program byte determination operation 802, the routine continues to program byte operation 810 where the update utility 29 programs the byte. During the program byte operation 810, the routine 800 enters a wait state for the byte in the first memory device and the routine 800 continues to the next memory device where the update utility 29 determines whether the first byte in the next memory device needs to be programmed at program byte determination operation 820. If it is determined that the first byte in the next memory device needs to be programmed, the routine 800 enters a wait state in the next memory device and returns to program byte determination operation 802 in the first memory device where the routine 800 resumes from the state in which it previously waited.

The operations of the routine 800 described above are recursively repeated by the update utility 29 until all of the bytes in the first block of the first memory device are programmed at which point the routine 800 continues to the next block of the first memory device by returning to operation 705 in the routine 700 discussed above in FIG. 7. Similarly, after all of the bytes in the first block of the next memory device are programmed, the routine 800 continues to the next block of the next memory device by returning to operation 730 in the routine 700 discussed above in FIG. 7.

It will be appreciated that the state machine routines 600-800 described above and implemented by the update utility 29 enables the simultaneous erasing and programming of blocks in multiple flash memory devices in a computer system as well as the optimization of block erase, block programming, and byte programming operations in such devices.

Although the invention has been described in language specific to computer structural features, methodological acts and by computer readable media, it is to be understood that the invention defined in the appended claims is not necessarily limited to the specific structures, acts or media described. Therefore, the specific structural features, acts and mediums are disclosed as exemplary embodiments implementing the claimed invention.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. A method for simultaneously programming the contents of a plurality of memory devices, the contents of each of the plurality of memory devices organized as a plurality of blocks, the method comprising:

(a) selecting one of the plurality of memory devices as a current device;

(b) determining whether a first block of the plurality of blocks of the current device needs to be programmed, wherein determining whether the first block of the plurality of blocks of the current device needs to be programmed comprises determining whether the first block of the plurality of blocks needs to be erased, and wherein determining whether the first block of the plurality of blocks needs to be erased comprises determining whether a plurality of bits in the first block of the plurality of blocks are set to a predetermined binary value indicating that the first block was previously erased, and if the plurality of bits in the first block of the plurality of blocks are not set to the predetermined binary value, then determining that the first block of the plurality of blocks needs to be erased;

(c) if it is determined that the first block of the current device needs to be programmed then, programming the first block of the plurality of blocks of the current device, and generating a first memory wait state upon programming the first block of the plurality of blocks of the current device;

(d) if it is determined that the first block of the current device does not need to be programmed then determining whether the next block of the plurality of blocks of the current device needs to be programmed;

(e) in response to the first memory wait state being generated by the current device, determining whether any of the plurality of blocks contained in any of the plurality of memory devices other than the current device remain to be programmed;

(f) in response to determining that the plurality of blocks contained in at least one of the plurality of memory devices other than the current device remain to be programmed, identifying a next memory device having a plurality of blocks to be programmed other than the current device;

(g) selecting the next memory device;

(h) determining whether a first block of the plurality of blocks of the next memory device needs to be programmed;

(i) if it is determined that the first block of the next memory device needs to be programmed then, programming the first block of the plurality of blocks of the next memory device, and generating a second memory wait state upon programming the first block of the plurality of blocks of the current device;

j) if it is determined that the first block of the next memory device does not need to be programmed then determining whether the next block of the plurality of blocks of the current device needs to be programmed;

(k) in response to the second memory wait state being generated by the next memory device, determining whether any of the plurality of blocks contained in any of the plurality of memory devices other than the current device and the next memory device remain to be programmed;

(l) in response to determining that none of the plurality of blocks contained in at least one of the plurality of memory devices other than the current device and the next memory device remain to be programmed, resuming from the first wait state, and determining whether the next block of the plurality of blocks of the current device needs to be programmed; and (m) repeating the operations (b)-(l) until the plurality of blocks contained in each of the plurality of memory devices have been programmed, wherein at least two of the plurality of memory devices are simultaneously programmed.

2. The method of claim 1, wherein determining whether a first block of the plurality of blocks of the current device needs to be programmed comprises determining whether at least one byte in the first block of the plurality of blocks needs to be programmed.

3. The method of claim 1, wherein programming the first block of the plurality of blocks of the current device comprises erasing the first block of the plurality of blocks of the current device.

4. The method of claim 3, wherein programming the first block of the plurality of blocks of the current device further comprises programming the first block of the plurality of blocks of the current device.

5. The method of claim 4, wherein programming the first block of the plurality of blocks of the current device comprises programming at least one byte in the first block of the plurality of blocks.

6. The method of claim 3, wherein erasing the first block of the plurality of blocks of the current device comprises setting a plurality of bits in the first block of the plurality of blocks to a predetermined binary value.

7. The method of claim 1, wherein the plurality of memory devices store a basic input output system.

8. A computer-storage medium having computer-executable instructions stored thereon which, when executed by a computer, cause the computer to perform the method of claim 1.

9. The method of claim 1, wherein determining whether the first block of the plurality of blocks of the current device needs to be programmed comprises determining that the first block of the plurality of blocks of the current device does not need to be programmed if data to be programmed into the first block is the same as data currently in the first block.

10. A computer system for simultaneously programming the contents of a plurality of memory devices, the system comprising:

a memory for storing a program containing code for programming the contents of the plurality of memory devices, wherein the contents of each of the plurality of memory devices is organized as a plurality of blocks; and a processor, functionally coupled to the memory and associated with the plurality of memory devices, the processor being responsive to computer-executable instructions contained in the program and configured to:

(a) select one of the plurality of memory devices as a current device;

(b) determine whether any of the plurality of blocks contained in the current device remains to be programmed;

(c) in response to determining that at least one of the plurality of blocks contained in the current device remains to be programmed, determine whether a first block of the plurality of blocks of the current device needs to be programmed or erased, wherein to determine whether the first block of the plurality of blocks of the current device needs to be erased, the processor is further configured to determine whether a plurality of bits in the first block of the plurality of blocks are set to a predetermined binary value indicating that the first block was previously erased, and if the plurality of bits in the first block of the plurality of blocks are not set to the predetermined binary value, then determine that the first block of the plurality of blocks needs to be erased;

(d) if it is determined that the first block of the current device needs to be programmed or erased then, program or erase the first block of the plurality of blocks of the current device, and generate a first memory wait state upon programming or erasing the first block of the plurality of blocks of the current device;

(e) if it is determined that the first block of the current device does not need to be programmed or erased then determine whether the next block of the plurality of blocks of the current device needs to be programmed or erased;

(f) in response to the first memory wait state being generated by the current device, determine whether any of the plurality of blocks contained in any of the plurality of memory devices other than the current device remain to be erased or programmed;

(g) in response to determining that the plurality of blocks contained in at least one of the plurality of memory devices other than the current device remain to be erased or programmed, identify a next memory device other than the current device having a plurality of blocks to be erased or programmed;

(h) select the next memory device;

(i) determine whether a first block of the plurality of blocks of the next memory device needs to be programmed or erased;

(j) if it is determined that the first block of the next memory device needs to be programmed or erased then, program or erase the first block of the plurality of blocks of the next memory device, and generate a second memory wait state upon programming the first block of the plurality of blocks of the current device;

(k) if it is determined that the first block of the next memory device does not need to be programmed or erased then determine whether the next block of the plurality of blocks of the current device needs to be programmed or erased;

(l) in response to the second memory wait state being generated by the next memory device, determine whether any of the plurality of blocks contained in any of the plurality of memory devices other than the current device and the next memory device remain to be programmed or erased;

(m) in response to determining that none of the plurality of blocks contained in at least one of the plurality of memory devices other than the current device and the next memory device remain to be programmed or erased, resume from the first wait state, and determine whether the next block of the plurality of blocks of the current device needs to be programmed or erased;

(n) recursively repeat the operations (b)-(m) until the plurality of memory devices have generated a plurality of memory wait states; and (o) in response to the plurality of memory wait states being generated by the plurality of memory devices, recursively repeat the operations (a)-(n) until the plurality of blocks contained in each of the plurality of memory devices have been erased or programmed.

11. The system of claim 10, wherein the plurality of memory devices store a basic input output system.

12. The method of claim 10, wherein to determine whether the first block of the plurality of blocks of the current device needs to be programmed, the processor is further configured to determine that the first block of the plurality of blocks of the current device does not need to be programmed if data to be programmed into the first block is the same as data currently in the first block.

13. A method for simultaneously programming the contents of a plurality of memory devices, the contents of each of the plurality of memory devices organized as a plurality of blocks, the method comprising:

(a) selecting one of the plurality of memory devices as a current device;

(b) determining whether a first block of the plurality of blocks of the current device needs to be programmed;

(c) if it is determined that the first block of the current device needs to be programmed then, programming the first block of the plurality of blocks of the current device, wherein programming the first block of the plurality of blocks of the current device comprises erasing the first block of the plurality of blocks of the current device, wherein erasing the first block of the plurality of blocks of the current device comprises setting a plurality of bits in the first block of the plurality of blocks to a predetermined binary value, and generating a first memory wait state upon programming the first block of the plurality of blocks of the current device;

(d) if it is determined that the first block of the current device does not need to be programmed then determining whether the next block of the plurality of blocks of the current device needs to be programmed;

(e) in response to the first memory wait state being generated by the current device, determining whether any of the plurality of blocks contained in any of the plurality of memory devices other than the current device remain to be programmed;

(f) in response to determining that the plurality of blocks contained in at least one of the plurality of memory devices other than the current device remain to be programmed, identifying a next memory device having a plurality of blocks to be programmed other than the current device;

(g) selecting the next memory device;

(h) determining whether a first block of the plurality of blocks of the next memory device needs to be programmed;

(i) if it is determined that the first block of the next memory device needs to be programmed then, programming the first block of the plurality of blocks of the next memory device, and generating a second memory wait state upon programming the first block of the plurality of blocks of the current device;

(j) if it is determined that the first block of the next memory device does not need to be programmed then determining whether the next block of the plurality of blocks of the current device needs to be programmed;

(k) in response to the second memory wait state being generated by the next memory device, determining whether any of the plurality of blocks contained in any of the plurality of memory devices other than the current device and the next memory device remain to be programmed;

(l) in response to determining that none of the plurality of blocks contained in at least one of the plurality of memory devices other than the current device and the next memory device remain to be programmed, resuming from the first wait state, and determining whether the next block of the plurality of blocks of the current device needs to be programmed; and (m) repeating the operations (b)-(l) until the plurality of blocks contained in each of the plurality of memory devices have been programmed, wherein at least two of the plurality of memory devices are simultaneously programmed.

14. The method of claim 13, wherein determining whether a first block of the plurality of blocks of the current device needs to be programmed comprises determining whether the first block of the plurality of blocks needs to be erased.

15. The method of claim 14, wherein determining whether the first block of the plurality of blocks needs to be erased comprises:

determining whether a plurality of bits in the first block of the plurality of blocks are set to a predetermined binary value indicating that the first block was previously erased; and if the plurality of bits in the first block of the plurality of blocks are not set to the predetermined binary value, then determining that the first block of the plurality of blocks needs to be erased.

16. The method of claim 14, wherein determining whether a first block of the plurality of blocks of the current device needs to be programmed comprises determining whether at least one byte in the first block of the plurality of blocks needs to be programmed.

17. The method of claim 13, wherein programming the first block of the plurality of blocks of the current device further comprises programming the first block of the plurality of blocks of the current device.

18. The method of claim 17, wherein programming the first block of the plurality of blocks of the current device comprises programming at least one byte in the first block of the plurality of blocks.

19. The method of claim 13, wherein the plurality of memory devices store a basic input output system.

20. The method of claim 13, wherein determining whether the first block of the plurality of blocks of the current device needs to be programmed comprises determining that the first block of the plurality of blocks of the current device does not need to be programmed if data to be programmed into the first block is the same as data currently in the first block.

* * * * *